United States Patent [19]

Ebner et al.

[11] 4,124,878
[45] Nov. 7, 1978

[54] INEXPENSIVE DEVICE FOR MOUNTING CIRCUIT BOARDS TO A MOTHER BOARD

[75] Inventors: Peter R. Ebner, South Nashua; Louis E. Griffith, Hampstead, both of N.H.

[73] Assignee: Itek Corporation, Lexington, Mass.

[21] Appl. No.: 801,971

[22] Filed: May 31, 1977

[51] Int. Cl.² .............................................. H02B 1/02
[52] U.S. Cl. ................................................... 361/415
[58] Field of Search ................................. 361/415, 391

[56] References Cited

U.S. PATENT DOCUMENTS

| | | | |
|---|---|---|---|
| 3,001,102 | 9/1961 | Stiefel et al. | 361/391 |
| 3,764,857 | 10/1973 | Bartlett | 361/415 |

OTHER PUBLICATIONS

Johson, L. L., "Card Retention Scheme", IBM Tech. Disc. Bull., vol. 14, No. 9, Feb. 1972, p. 2671.

*Primary Examiner*—David Smith, Jr.

*Attorney, Agent, or Firm*—Homer O. Blair; Robert L. Nathans

[57] ABSTRACT

A plurality of circuit boards having male pin connectors are connected to a mother board having female pin receptor connectors, each circuit board being supported by a pair of grooved edge guide means. After the circuit boards are inserted into the device, a cover having a resilient foam pad on the inside surface thereof is closed wherein the foam pad resiliently presses against the upper edges of the circuit boards to hold them into position and maintain good electrical integrity with respect to the aforesaid connectors at the bottom portions of the circuit boards. Edge connectors may be plugged into the sides of the boards for further electrical access, and the heights of the edge guide means are high enough so that lower portions of the edge connectors are blocked and held in position by upper portions of the edge guides to prevent the edge connectors from being dislodged or loosened from the sides of the circuit boards.

2 Claims, 2 Drawing Figures

INEXPENSIVE DEVICE FOR MOUNTING CIRCUIT BOARDS TO A MOTHER BOARD

BACKGROUND OF THE INVENTION

This invention relates to printed circuit board support structure.

A number of devices have been employed wherein a plurality of generally parallel circuit boards are connected to a mother board by conventional electrical connectors. It is extremely important that electrical integrity be maintained with respect to the connector interfaces between the circuit boards and interfaced circuitry such as a mother board. The loosening of such connectors often means that the machine must be shut down and serviced. Also the maintenance of electrical integrity is often compromised by machine vibration. A number of devices for maintaining such electrical integrity are taught by the prior art but are complex and relatively expensive. For example, in U.S. Pat. No. 3,848,953 to Petroshanoff, each circuit board is screwed in position by a jackscrew which is mounted by a coupling member to its associated circuit board. Individual, rigid struts are also affixed to each circuit board in order to attempt to distribute the load produced by closure of a cover over the device. Since this structure must be added to each circuit board this approach is relatively costly. Furthermore, it is desirable to eliminate the labor required to manipulate the jackscrew of each card upon insertion of the card and before its removal. U.S. Pat. No. 3,702,423 to Kern discloses complex wedging devices associated with each circuit board to maintain electrical integrity. U.S. Pat. No. 3,912,353 to Kasuya et al employs complex resilient gripping devices. Likewise, with respect to U.S. Pat. No. 3,664,868 to Nevala.

SUMMARY OF THE INVENTION

The maintenance of electrical integrity and positive positioning of the circuit boards is effected in a simple and inexpensive manner in accordance with the present invention. One aspect of the invention employs an inexpensive resilient cover means preferably having a resilient foam pad thereon which presses against the edges of the circuit boards opposite the edges associated with the connectors, and as a result, the desired pressure between the mating connectors is maintained in a simple manner which, due to the resilient pad, need not require high tolerance cover structure. Furthermore, in contrast with the prior art, special structure need not be associated with each circuit board although conventional pivoted clips may be employed if desired. In accordance with another aspect of the invention, the grooved edge guide means which slidably receive the edges of the inserted circuit boards have a height such that upper portions of the guide means prevent, by a blocking action, the loosening of edge plug connectors which may be optionally employed to provide for further electrical access to the circuit boards.

Other objects, features and advantages of the present invention will become apparent upon perusal of the detailed description taken in conjunction with the drawings in which:

FIG. 1 discloses an overall perspective of a preferred embodiment; and

FIG. 2 illustrates a portion of FIG. 1.

DETAILED DESCRIPTION

Figure 1:
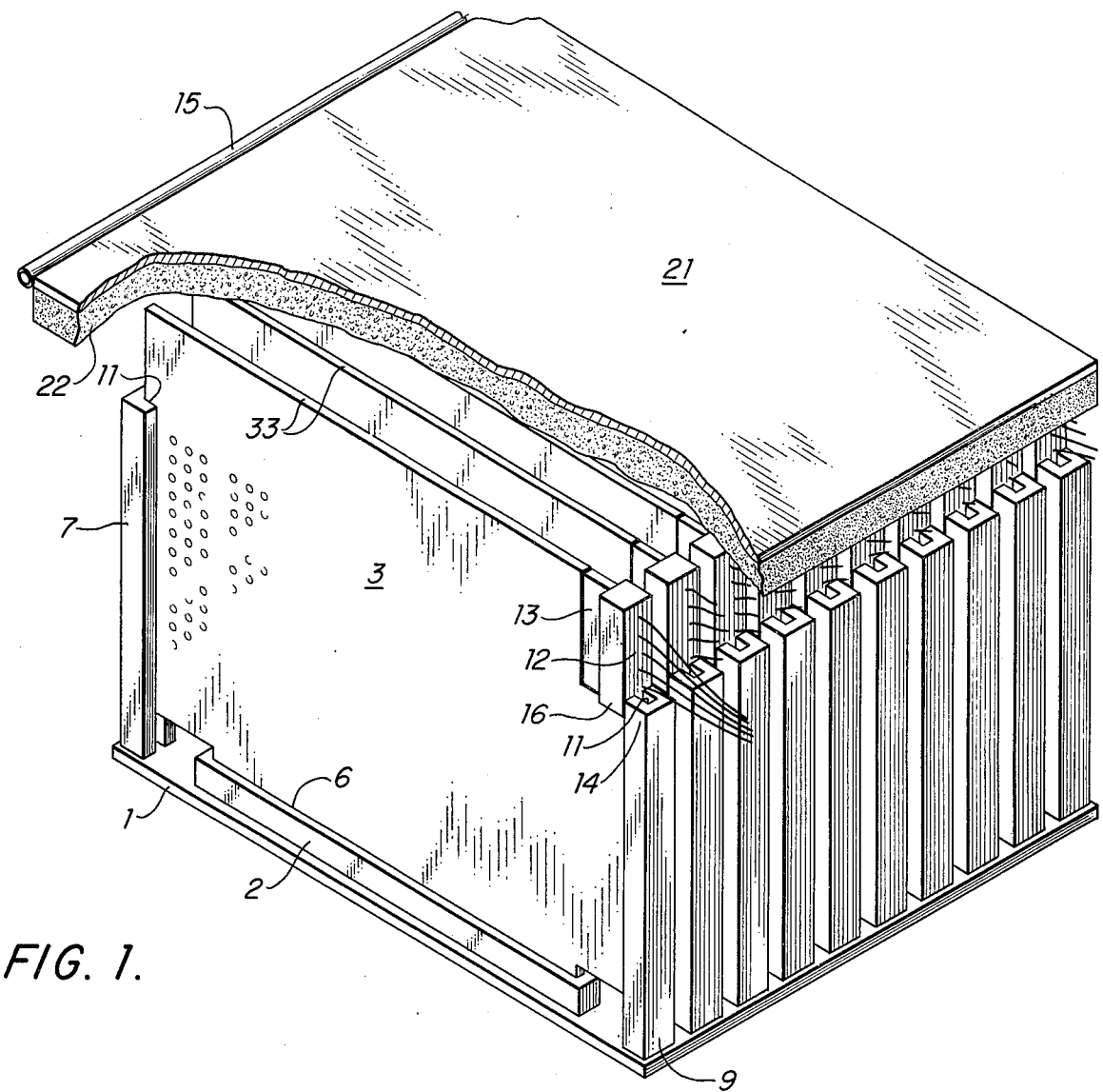
Figure 2:
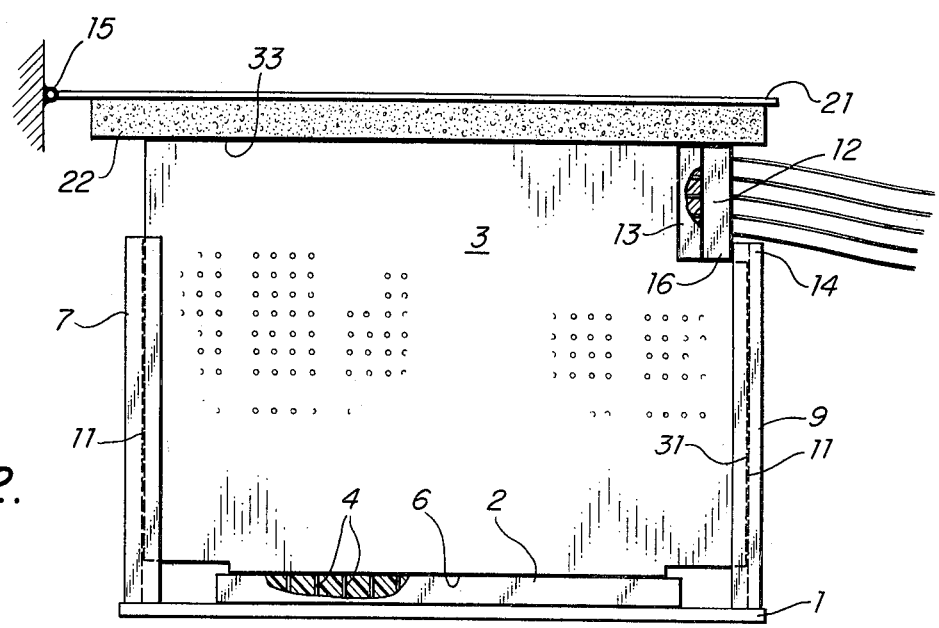

Referring now to the FIGS., a mother board 1 is disclosed having a plurality of female pin connectors 2 mounted upon the mother board, one for each circuit board. Circuit board 3 has a male pin connector 4 adjacent its lower edge 6. Edge guide members 7 and 9 have grooves 11 therein for slidably receiving the side edges of circuit board 3. Upon completion of insertion of board 3, the male pin connector 4 mates with the female receptor connector 2. The remaining boards are likewise inserted into associated grooved edge guide means similar to guide means 7 and 9. Optionally, edge plug connector 12 may be fitted into connector 13 mounted upon the side portion of circuit card 3 if further electrical access to the components of board 3 is desired. It may be noted that the upper portion 14 of edge guide means 9 is higher than the lowermost portion 16 of edge connector 12 so that plug connector 12 is effectively blocked by the upper portion 14 of edge guide 3 to maintain the electrical integrity of the edge connection by preventing loosening of plug connector 12. A similar arrangement may, if desired, be provided through the use of an additional edge connector at the opposite side edge of the card. This arrangement is further illustrated in FIG. 2. Where a side edge plugged connector 12 is employed, the side edge 31 of the circuit board is contained within the groove 11 formed within edge guide member 9. However, the upper portion of the side edge of the card is indented, so that the plugged connector 12 may be positioned to the left of the upper portion 14 of the guide member 9. With this arrangement, the left side of edge guide portion 14 effectively prevents plugged connector 12 from being loosened due to the blocking action of portion 14. If side connectors are not employed the cards need not be indented, but will be effectively held in position by the resilient cover means.

After the insertion of all of the generally parallel cards, the cover 21 having a rectangular foam body 22 affixed to the lower surface thereof, is lowered over the device so that the foam body resiliently presses against the upper edges 33 of the circuit cards, thereby to firmly maintain them seated in the device. Obviously other forms of resilient cover means may be employed other than the use of an individual rectangular foam body, although such body is greatly preferred in the interest of simplicity and low cost.

Thus in summary, the above described arrangement maintains electrical integrity of the connectors regardless of machine vibration over the life of the device and does so in a manner which is simplicity in itself, in contrast with prior art methods known to the inventor. For holding the cards, conventional clips and cages may be eliminated, and air flow between the cards is unrestricted.

While preferred embodiments of the invention have been described, the teachings of this invention will readily suggest many other embodiments to those skilled in the art and thus the invention is to be limited only by the permissible scope of the following claims.

What is claimed is:

1. A device for containing a plurality of circuit boards comprising:
   a. first electrical connector means of said device for attaining access to the circuitry in said plurality of circuit boards;
   b. first edge guide means for receiving one stationary edge of said circuit boards;

c. second stationary edge guide means for receiving an opposite edge of said circuit boards;
d. second electrical connector means positioned upon said boards for mating with said first electrical connector means;
e. third electrical connector means positioned along an edge of said circuit boards for providing access to the circuitry of said circuit boards, said third electrical connector means being positioned along said edge to be in a blocking relationship with respect to its associated stationary edge guide means so that upon the complete insertion of the circuit boards within said device, said third electrical connector means cannot be displaced from the edge of its associated circuit board; and
f. resilient cover means for pressing against edges of said circuit boards upon closure of said cover means to maintain said circuit boards in position within said device.

2. The combination as set forth in claim 1 wherein said first and second edge guide means include grooves for slidably receiving said circuit boards.

* * * * *